(12) United States Patent
Noda

(10) Patent No.: US 7,812,385 B2
(45) Date of Patent: Oct. 12, 2010

(54) FERROELECTRIC CAPACITOR DEVICE AND METHOD WITH OPTIMUM HYSTERESIS CHARACTERISTICS

(75) Inventor: Takafumi Noda, Matsumoto (JP)

(73) Assignee: Seiko Epson Corporation (JP)

( * ) Notice: Subject to any disclaimer, the term of this patent is extended or adjusted under 35 U.S.C. 154(b) by 143 days.

(21) Appl. No.: 12/171,590

(22) Filed: Jul. 11, 2008

(65) Prior Publication Data

US 2009/0072286 A1    Mar. 19, 2009

(30) Foreign Application Priority Data

Sep. 18, 2007  (JP)  ............... 2007-241016

(51) Int. Cl.
*H01L 31/062*  (2006.01)
(52) U.S. Cl. ............... 257/295; 257/E21.008; 257/E27.098; 257/E29.342; 438/3
(58) Field of Classification Search ........ 257/295, 257/E29.342, E21.008, E27.098; 438/3
See application file for complete search history.

(56) References Cited

U.S. PATENT DOCUMENTS

2006/0244023 A1   11/2006   Kanaya

FOREIGN PATENT DOCUMENTS

| JP | 09-213798 | 8/1997 |
| JP | 2003-347512 | 12/2003 |
| JP | 2006-310637 | 11/2006 |
| JP | 2006-332594 | 12/2006 |
| JP | 2007-027532 | 2/2007 |
| JP | 2007-109975 | 4/2007 |

OTHER PUBLICATIONS

Machine English translation of JP 2007-27532, cited on IDS filed Oct. 27, 2009.*

* cited by examiner

*Primary Examiner*—Wael M Fahmy
*Assistant Examiner*—John C Ingham
(74) *Attorney, Agent, or Firm*—Harness, Dickey & Pierce, P.L.C.

(57) ABSTRACT

A semiconductor device includes: a ferroelectric capacitor that is provided above a base substrate and includes a first electrode, a ferroelectric film provided on the first electrode and a second electrode provided on the ferroelectric film; a stopper film that covers a top surface of the second electrode of the ferroelectric capacitor; a hydrogen barrier film that covers a top surface and a side surface of the stopper film and a side surface of the ferroelectric capacitor; an interlayer dielectric film that covers the hydrogen barrier film and the base substrate; a contact hole that penetrates the interlayer dielectric film, the hydrogen barrier film and the stopper film and exposes the second electrode; a barrier metal that covers the second electrode exposed in the contact hole and an inner wall surface of the contact hole and is composed of a conductive material having hydrogen barrier property; and a plug conductive section that is embedded in the contact hole and conductively connects to the barrier metal, wherein the stopper film is formed from a dielectric material having a smaller etching rate than an etching rate of the interlayer dielectric film.

9 Claims, 5 Drawing Sheets

FERROELECTRIC CAPACITOR DEVICE AND METHOD WITH OPTIMUM HYSTERESIS CHARACTERISTICS

The entire disclosure of Japanese Patent Application No. 2007-241016, filed Sep. 18, 2007 is expressly incorporated by reference herein.

BACKGROUND

1. Technical Field

The present invention relates to semiconductor devices, and also relates to methods for manufacturing the same.

2. Related Art

Ferroelectric memory devices (FeRAM) are nonvolatile memories capable of low voltage and high speed operations, and their memory cells can be each formed from one transistor and one capacitor (1T/1C). Accordingly, ferroelectric memory devices can achieve integration at the same level of that of DRAM, and are therefore expected as large-capacity nonvolatile memories.

As the structures of such ferroelectric memory devices, a planer type (see, for example, Japanese laid-open patent application JP-A-2003-347512) and a stacked type (see, for example, Japanese laid-open patent application JP-A-2006-310637) may be enumerated. A ferroelectric memory device in either of the structures is equipped with a ferroelectric capacitor having a ferroelectric film placed between a pair of electrodes. One of the pair of electrodes is connected to a bit line through a transistor, and the other electrode is connected to a ground line or the like. Generally, they are electrically connected through plugs that may be composed of tungsten or the like.

The ferroelectric film described above may be formed from a ferroelectric material having a perovskite type crystal structure represented by a general formula $ABO_3$, and more specifically, may be composed of lead zirconate titanate (Pb (Zi, Ti) $O_3$: PZT) or the like. The ferroelectric material is an oxide, and therefore needs care so as not to be reduced and thus deteriorated.

Therefore, according to the aforementioned patent documents, a hydrogen barrier film that covers the ferroelectric capacitor is formed, such that the ferroelectric film would not be reduced when exposed to a reducing atmosphere in later steps. According to the document JP-A-2003-347512, when forming plugs on ferroelectric capacitors to be connected to the plugs, a titanium nitride film (barrier metal) having hydrogen barrier property is formed inside contact holes in which the plugs are formed, whereby the ferroelectric film can be prevented from being reduced even when the plugs are formed in a reducing atmosphere.

However, if the measures are not sufficient against the reducing atmosphere at the time of forming the plugs over the ferroelectric capacitor in the methods described in the aforementioned patent documents, the ferroelectric film may possibly be deteriorated. Generally, an interlayer dielectric film is formed to a sufficient thickness, and then polished and thinned by a CMP method or the like, to obtain a desired thickness. However, due to differences in the thickness of the film at the time of film formation and the polishing amount caused by unevenness in the base layer, the interlayer dielectric film may have differences in its thickness. For this reason, when forming contact holes by etching the interlayer dielectric film and the hydrogen barrier film, the differences in the thickness of the interlayer dielectric film are reflected in the hydrogen barrier film, which makes it difficult to uniformly etch the hydrogen barrier film.

As a result, the side wall of the hydrogen barrier film in the contact hole cannot be formed into a desired shape. When a titanium nitride film (barrier metal) is formed, as described in the document JP-A-2003-347512, weak points are created in the film, such that the titanium nitride film cannot be functioned satisfactorily. For example, the hydrogen barrier film is excessively etched in thinner portions of the interlayer dielectric film, and the side wall of the hydrogen barrier film forms a shape that rises perpendicularly with respect to the upper electrode, as shown in FIG. 1 of the document JP-A-2003-347512. Therefore, it is difficult to fill the barrier metal material well into corners at the stepped sections, which present weak points.

When such weak points are formed, a reducing gas may penetrate the ferroelectric capacitor through the weak points at the time of forming the plugs, thereby reducing the ferroelectric film and causing oxygen deficiencies and deterioration. Memory cells with the deteriorated ferroelectric films cannot provide good hysteresis characteristic, and therefore present bit failures, whereby the bit yield is deteriorated.

SUMMARY

In accordance with an advantage of some aspects of the invention, a semiconductor device equipped with ferroelectric capacitors having excellent hysteresis characteristics and excellent bit yield is provided, and a method for manufacturing the same is also provided.

A semiconductor device in accordance with an embodiment of the invention includes: a ferroelectric capacitor including a first electrode provided above a base substrate, a ferroelectric film provided on the first electrode and a second electrode provided on the ferroelectric film; a stopper film that covers a top surface of the second electrode of the ferroelectric capacitor; a hydrogen barrier film that covers a top surface and a side surface of the stopper film and a side surface of the ferroelectric capacitor; an interlayer dielectric film that covers the hydrogen barrier film and the base substrate; a contact hole that penetrates the interlayer dielectric film, the hydrogen barrier film and the stopper film and exposes the second electrode; a barrier metal that covers the second electrode exposed in the contact hole and an inner wall surface of the contact hole and is composed of a conductive material having hydrogen barrier property; and a plug conductive section that is embedded in the contact hole and conductively connects to the barrier metal, wherein the stopper film is formed from a dielectric material having a smaller etching rate than an etching rate of the interlayer dielectric film.

As a result, the stopper film can be functioned as an etching stopper at the time of etching the interlayer dielectric film, such that differences in the thickness of the interlayer dielectric film can be absorbed by the stopper film, and differences in etching can be almost entirely eliminated. Accordingly, differences in the thickness of the stopper film due to differences in the thickness of the interlayer dielectric film can be reduced, and therefore the contact hole can be processed in a highly accurate shape. Therefore, the inner wall surface of the stopper film in the contact hole can be formed in a shape that provides the barrier metal material with a favorable coverage property, whereby generation of weak points in the barrier metal can be prevented. As a result, reducing gas can be prevented from penetrating the ferroelectric film side from the second electrode side through weak points, whereby reduction and deterioration of the ferroelectric film by the reducing gas can be prevented. Therefore, the ferroelectric capacitor can be formed with excellent hysteresis characteristics, and the semiconductor device equipped with the ferroelectric capacitor has an improved bit yield.

The stopper film may preferably be formed from a material having an etching selection ratio of 15 or higher with respect to the interlayer dielectric film.

As a result, the stopper film can function sufficiently, such that the processing accuracy of the inner wall surface of the contact hole at the stopper film can be further improved.

The stopper film may preferably have hydrogen barrier property. As a result, a portion of the hydrogen barrier film that is covered by the stopper film has enhanced hydrogen barrier property, such that penetration of reducing gas into the ferroelectric capacitor is further reduced, and therefore deterioration of the ferroelectric film can be more securely prevented.

Also, the stopper film may preferably be comprised of silicon nitride. Normally, the interlayer dielectric film is comprised of silicon oxide, and thus the stopper film comprised of silicon nitride has a sufficiently high etching selection ratio with respect to the interlayer dielectric film comprised of silicon oxide, and therefore can sufficiently function as an etching stopper. Also, as the silicon nitride has hydrogen barrier property, the hydrogen barrier property of the hydrogen barrier film can be enhanced at portions covered by the stopper film, and therefore deterioration of the ferroelectric film can be more securely prevented, as described above.

Also, the inner wall surface of the stopper film in the contact hole includes a concave curved surface facing the interior of the contact hole, and the contact hole at the stopper film has an inner diameter that gradually becomes smaller toward the second electrode. As a result, no steep step difference is formed between the top surface of the second electrode and the inner wall surface of the contact hole, such that the coverage property of the barrier metal material can be sufficiently improved.

In accordance with an embodiment of the invention, a method for manufacturing a semiconductor device includes the steps of: forming a laminate having a ferroelectric capacitor including a first electrode, a ferroelectric film and a second electrode successively laminated above a substrate and a stopper film covering a top surface of the second electrode of the ferroelectric capacitor; forming a hydrogen barrier film that covers a top surface and a side surface of the stopper film and a side surface of the ferroelectric capacitor; forming an interlayer dielectric film that covers the hydrogen barrier film and the substrate; etching the interlayer dielectric film, hydrogen barrier film and the stopper film thereby forming a contact hole that exposes the second electrode; forming a barrier metal that covers the second electrode exposed in the contact hole and an inner wall surface of the contact hole and is composed of a conductive material having hydrogen barrier property; and embedding a plug conductive section conductively connected to the barrier metal inside the contact hole, wherein the stopper film is formed from a material that creates an etching selection ratio with respect to the interlayer dielectric film.

As the stopper film is formed from a material that creates an etching selection ratio with respect to the interlayer dielectric film, the stopper film can be functioned as an etching stopper at the time of etching the interlayer dielectric film in the step of forming a contact hole, such that differences in the thickness of the interlayer dielectric film can be absorbed by the stopper film, and differences in etching can be almost entirely eliminated. Accordingly, differences in the thickness of the stopper film can be reduced, and therefore the stopper film can be etched with high accuracy, and the contact hole can be formed in a highly accurate shape. Therefore, the inner wall surface of the contact hole at the stopper film can be formed in a shape that provides the barrier metal material with favorable coverage property, whereby generation of weak points in the barrier metal can be prevented.

As a result, when the plug conductive section is formed in a reducing atmosphere, reducing gas can be prevented from penetrating the ferroelectric capacitor through weak points, and therefore the ferroelectric film can be prevented from being reduced or deteriorated. Therefore, the ferroelectric capacitor can be formed with excellent hysteresis characteristics, and a semiconductor device equipped with the ferroelectric capacitor having an improved bit yield can be manufactured.

Furthermore, in the step of forming a laminate, material films for the first electrode, the ferroelectric film and the second film may preferably be successively formed above the substrate, and after forming the stopper film on the material films, the material films may preferably be etched using the stopper film as a mask to form the laminate. As a result, a semiconductor device with better bit yield than that of a semiconductor device in related art can be manufactured without increasing the number of process steps compared to the method in prior art. Also, no alignment deviation is created between the stopper film and the ferroelectric capacitor, such that damages to the yield can be prevented, and the semiconductor device can be more efficiently manufactured.

DESCRIPTION OF EXEMPLARY EMBODIMENTS

An embodiment of the invention is described below with reference to the accompanying drawings. However, it should be noted that the technical scope of the invention is not limited to the embodiment described below. Also, although various structures may be exemplified in the following description, using the accompanying drawings, the measurement and scale of each of the components of the structures illustrated in each of the drawings may be appropriately changed with respect to the actual structures so that characteristic features of each of the structures can be readily recognized.

Figure 1:
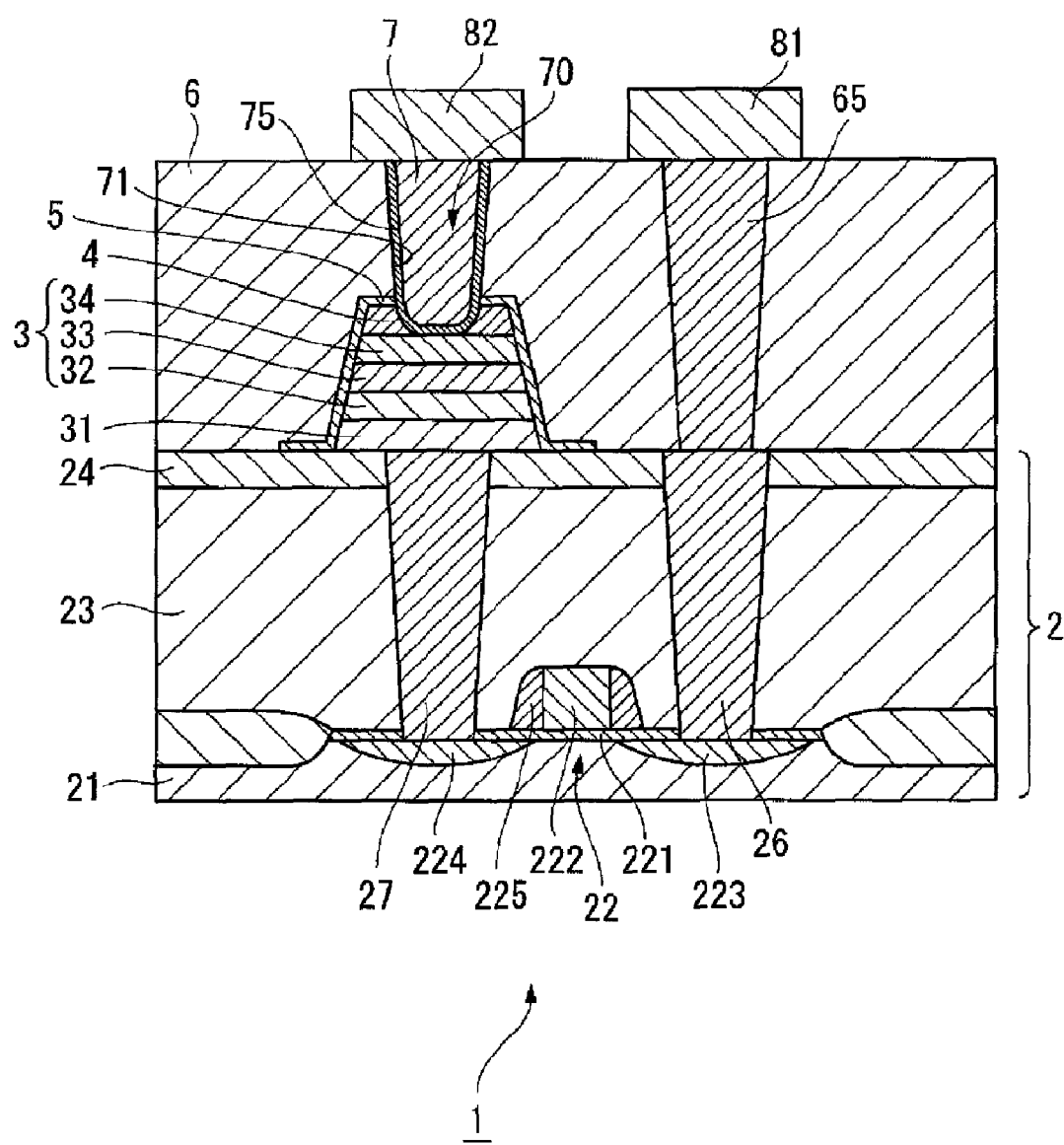
FIG. 1 is a side cross-sectional view of the structure of a semiconductor device in accordance with an embodiment of the invention.

FIG. 1 is a side cross-sectional structural view of a portion of a semiconductor device (ferroelectric memory device) 1 in accordance with an embodiment of the invention. As shown in FIG. 1, the ferroelectric memory device 1 has a stacked type structure, and is equipped with a ferroelectric capacitor 3 provided on a base substrate 2, a stopper film 4 that covers a top surface of the ferroelectric capacitor 3, a hydrogen barrier film 5 that covers a top surface and a side surface of the stopper film 4 and a side surface of the ferroelectric capacitor 3, and an interlayer dielectric film 6 that covers the hydrogen barrier film a and the base substrate 2. Also, in accordance with the present embodiment, a bit line 81 and a ground line 82 comprised of aluminum are provided on the interlayer dielectric film 6.

The base substrate 2 includes, in accordance with the present embodiment, a transistor 22 provided on a silicon substrate (substrate) 21, a first base dielectric film 23 comprised of $SiO_2$ that covers the transistor 22, and a second base dielectric film 24 comprised of SiN that covers the first base dielectric film 23. Element isolation regions 25 are provided on a surface layer of the silicon substrate 21, wherein each area between the element isolation regions 25 corresponds to each of the memory cells.

The transistor 22 is formed from a gate dielectric film 221 provided on the silicon substrate 21, a gate electrode 222 provided on the gate dielectric film 221, a source region 223 and a drain region 224 provided on both sides of the gate electrode 222 in the surface layer of the silicon substrate 21, and a side wall 225 provided on a side surface of the gate electrode 222. In the present embodiment, a first plug 26 composed of tungsten is provided on the source region 223 in a manner to be conductively connected to the source region 223, and a second plug 27 composed of tungsten is provided on the drain region 224 in a manner to be conductively connected to the drain region 224. The first plug 26 is electrically connected to a third plug 65 composed of tungsten that is provided in the interlayer dielectric film 6, and the third plug 65 is electrically connected to the bit line 81. In other words, the source region 223 of the transistor 22 is electrically connected to the bit line 81 through the first plug 26 and the third plug 65.

The ferroelectric capacitor 3 is provide on a second plug 27, and is formed from a lower electrode (first electrode) 32, a ferroelectric film 33 and an upper electrode (second electrode) 34. Further, in the present embodiment, a base conductive section 31 composed of TiAlN is provided between the second plug 27 and the ferroelectric capacitor 3.

In the present embodiment, the lower electrode 32 is formed from an iridium (Ir) film, an iridium oxide (IrOx) film and a platinum (Pt) film sequentially laminated on the base conductive section 31, and is electrically connected to the drain region 224 through the base conductive section 31 and the second plug 27.

The ferroelectric film 33 is provided on the lower electrode 32 and is formed from a ferroelectric material. Typical ferroelectric materials include materials having a perovskite crystal structure that may be expressed by a general formula $ABO_3$, more specifically, for example, PZT (Pb (Zr, Ti) $O_3$), PLZT ((Pb, La) (Zr, Ti) $O_3$) and the like, or ferroelectric materials in which metal, such as, niobate (Nb) or the like is added to the foregoing materials. As the ferroelectric material in the present embodiment, PZT is used.

The upper electrode 34 is formed from a Pt film, an IrOx film and an Ir film sequentially provided on the ferroelectric film 33, and is electrically connected to a fourth plug (plug conductive section) 7 to be described below.

In this manner, each of the upper electrode 34 and the lower electrode 32 may be formed from a laminate of multiple films composed of mutually different materials. As a result, functionalities can be given to the upper electrode 34 and the lower electrode 32. For example, it may be possible to add a function to increase adhesion between the ferroelectric film 33 and the upper electrode 34 and/or between the ferroelectric film 33 and the lower electrode 32, a function as an oxygen barrier film or a hydrogen barrier film, a function as an oxygen barrier film or a hydrogen barrier film, a function to improve the crystal orientation property of the ferroelectric film 33 and the like.

The hydrogen barrier film 5 is formed from a dielectric material having hydrogen barrier property, and for example, aluminum oxide (Al Ox) is used as the material for the hydrogen barrier film 5 in the present embodiment. The ferroelectric film 33 of the ferroelectric capacitor 3 is formed from an oxide material, as described above, such that the ferroelectric film 3 may be reduced and deteriorated when exposed to reducing gas such as hydrogen gas. However, by covering the ferroelectric capacitor 3 with the hydrogen barrier film 5, deterioration thereof can be prevented.

The stopper film 4 is formed from a material that can secure an etching selection ratio with respect to the interlayer dielectric film 6, in etching to be conducted to form a contact hole 70 to be described below, and can be functioned as a stopper in the etching. The stopper film 4 may preferably be formed from a material that provides an etching selection ratio of 15 or higher with respect to the interlayer dielectric film 6, such that the stopper film 4 can sufficiently function as a stopper. Also, the stopper film 4 may preferably have hydrogen barrier property, whereby the hydrogen barrier property of the hydrogen barrier film 5 can be reinforced. More specifically, the material for the stopper film 4 may preferably be silicon nitride, such as, SiN, SiON and the like. In accordance with the present embodiment, the interlayer dielectric film 6 is formed from $SiO_2$, and the stopper film 4 is formed from SiN.

A contact hole 70 that penetrates the interlayer dielectric film 6, the hydrogen barrier film 5 and the stopper film 4, and exposes the upper electrode 34 of the ferroelectric capacitor 3 is formed over the ferroelectric capacitor 3. The contact hole 70 has a circular opening shape, and its interior is provided with a barrier metal 75 that covers the top surface of the upper electrode 34 exposed in the contact hole 70 and an inner wall surface of the contact hole 70. Also, a fourth plug (plug conductive section) 7 is embedded inside the barrier metal 75 in the contact hole 70. The fourth plug 7 is formed from tungsten in the present embodiment, and is conductively connected to the upper electrode 34 through the barrier metal 75, and electrically connected to the ground line 82. In other words, the upper electrode 34 of the ferroelectric capacitor 3 is electrically connected to the ground line 82.

The barrier metal 75 is formed from a conductive material having hydrogen barrier property, and a portion thereof that covers the top surface of the upper electrode 34 can prevent reducing gas from penetrating the ferroelectric capacitor 3 from the side of the contact hole 70. Also, a portion of the barrier metal 75 that covers the inner wall surface 71 inside the contact hole 70 is capable of increasing the adhesion between the fourth plug 7 and the inner wall surface 71 of the contact hole 70. In the present embodiment, the barrier metal 75 has a two-layer structure in which a Ti film (not shown) and a TiN film (not shown) are sequentially laminated. Also, as the inner wall surface of the contact hole 70 at the stopper film 4 is well shaped as described below, the barrier metal 75 is provided with improved material coverage, and does not have weak points. The shape of the inner wall surface of the stopper film 4 is described below in detail.

Figure 2A:
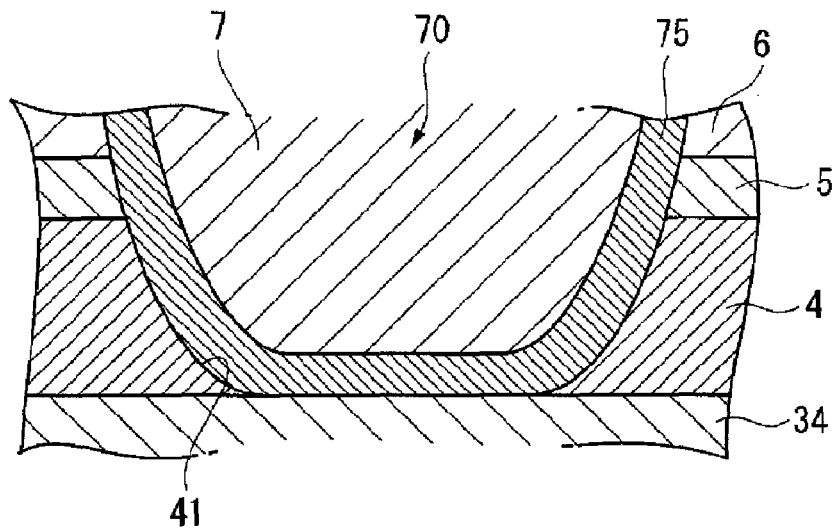
FIGS. 2A-2D are schematic views and graphs for describing the shape of a main portion of the semiconductor device.
Figure 2B:
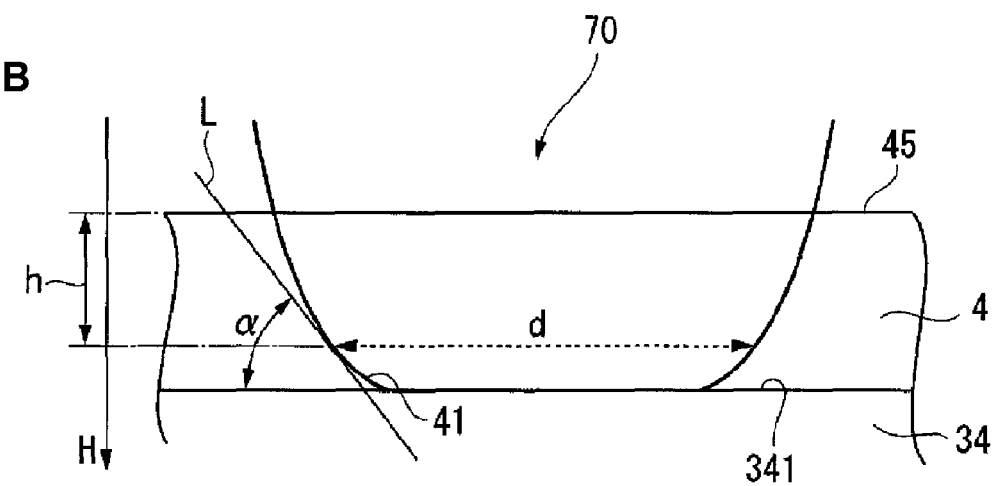
Figure 2C:
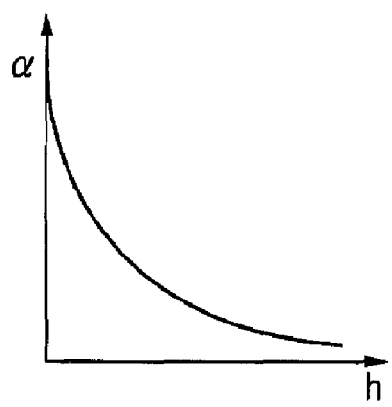
Figure 2D:
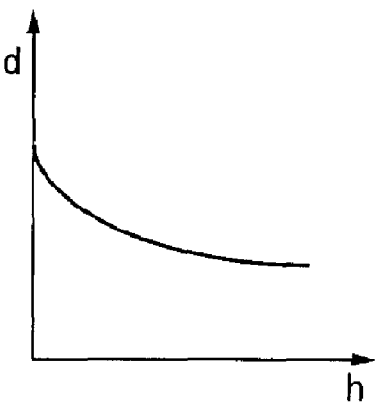

FIG. 2A is an enlarged cross-sectional view of a portion of the contact hole 70 near its bottom surface, and FIG. 2B is a schematic diagram for describing several parameters concerning the configuration representation of the inner wall surface 41 of the stopper film 4. Also, FIGS. 2C and 2D are graphs showing the relations among the parameters in the shape of the inner wall surface 41.

As shown in FIG. 2A, the inner wall surface 41 of the stopper film 4 includes a concave curved surface facing the interior of the contact hole 70. Also, the inner diameter of the contact hole 70 gradually reduces toward the upper electrode 34.

As shown in FIG. 2B, a distance from the upper surface 45 of the stopper film 4 in a depth direction H of the contact hole 70 is defined as a depth h. A tangential line that contacts the inner wall surface 41 of the stopper film 4 at the depth h in the hydrogen barrier film 4 is defined as a tangential line L. An acute angle among angles of the tangential line L with respect to the upper surface 341 of the upper electrode 34 is defined as an angle $\alpha$. A dimension of the contact hole 70 at the depth h in a direction orthogonal to the depth direction H is defined as an inner diameter d. With the parameters set as described above, it is observed that the angle $\alpha$ decreases monotonically with increasing depth h, as shown in FIG. 2C, and the inner diameter d decreases monotonically with increasing depth h, as shown in FIG. 2D.

With the structure described above, upon application of a voltage to the gate electrode 222 of the transistor 22, an electrical field is applied between the source region 223 and the drain region 224 thereby turning on the channel, wherein an electrical current can be circulated. When the channel is turned on, an electrical signal from the bit line 81 electrically connected to the source region 223 is transmitted to the drain region 224, and then transmitted to the lower electrode 32 of the ferroelectric capacitor 3 electrically connected to the drain electrode 224. Thus, a voltage can be applied between the upper electrode 34 and the lower electrode 32 of the ferroelectric capacitor 3, whereby a charge (data) can be accumulated in the ferroelectric film 33. In this manner, an electrical signal to the ferroelectric capacitor 3 can be switched by the transistor 22, whereby data (charge) can be read from or written in the ferroelectric memory device 1.

Next, a method for manufacturing a semiconductor device in accordance with an embodiment of the invention is described, using a method for manufacturing the ferroelectric memory device 1 as an example.

FIGS. 3A-3D, FIGS. 4A-4C, and FIGS. 5A-5C are cross-sectional views showing steps of a method for manufacturing the ferroelectric memory device 1 in accordance with the present embodiment. It is noted that FIGS. 3B-3D, FIGS. 4A-4C, and FIGS. 5A-5B show only a main portion of the ferroelectric memory device, and omits illustration of lower structural elements such as a transistor 22 and the like.

Figure 3A:
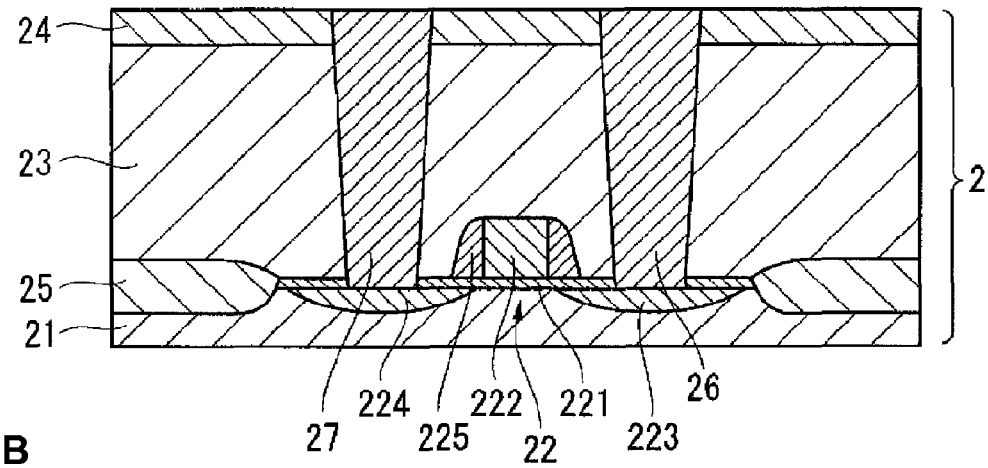
FIGS. 3A-3D are cross-sectional views schematically showing steps of a method for manufacturing a semiconductor device.

First, as shown in FIG. 3A, a base substrate 2 is formed by using a known method. More specifically, for example, element isolation regions 25 are formed in a silicon substrate (substrate) 21 by a LOCOS method, a STI method or the like, and a gate dielectric film 221 is formed on the silicon substrate 21 between the element isolation regions 25 by a thermal oxidation method or the like. Then, a gate electrode 222 composed of polycrystal silicon or the like is formed on the gate dielectric film 221. Then, doped regions 223 and 224 are formed by implanting impurities in the surface layer of the silicon substrate 21 between the element isolation regions 25 and the gate electrode 222. Then, an etching back method or the like is used to form a side wall 225. In accordance with the present embodiment, the doped region 223 may be functioned as a source region, and the doped region 224 may be functioned as a drain region.

Then, a film of $SiO_2$ is formed by, for example, a CVD method to form a first base dielectric film 23 on the silicon substrate 21 where the transistor 22 is formed, and then a film of SiN is formed by, for example, a CVD method to form a second base dielectric film 24 on the first base dielectric film 23. Then, the first base dielectric film 23 and the second base dielectric film 24 over the source region 223 and the drain region 224 are etched, thereby forming a through hole that exposes the source region 223 and a through hole that exposes the drain region 224. Then, for example, films of Ti and TiN are sequentially formed by, for example, a sputter method in the through holes, respectively, thereby forming adhesion layers (not shown).

Then, a film of tungsten is formed by, for example, a CVD method over the entire surface of the second base dielectric film 24 including portions inside the through holes thereby embedding tungsten inside the through holes. Then, the tungsten over the second base dielectric film 24 is polished by a CMP method or the like, thereby removing the tungsten on the second base dielectric film 24. As a result, a first plug 26 and a second plug 27 are embedded in the through holes, respectively. The second base dielectric film 24 composed of SiN has a lower polishing rate in a CMP method than that of the first base dielectric film 23 composed of $SiO_2$, such that portions above the first base dielectric film 23 can be prevented from being excessively polished by the CMP method.

Figure 3B:
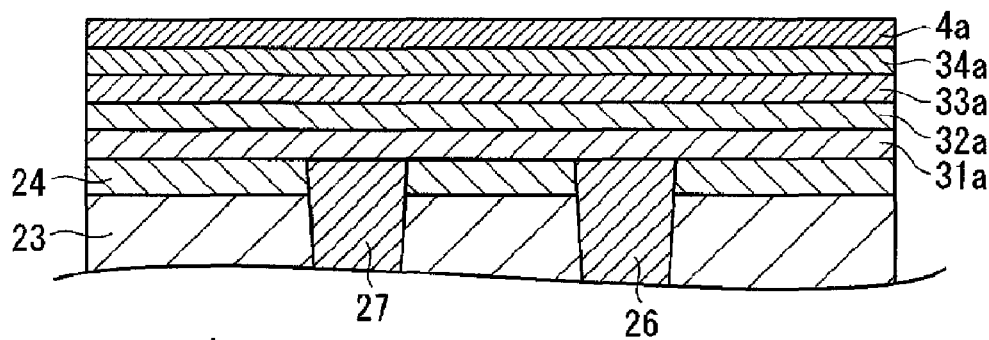

Next, as shown in FIG. 3B, material films for a ferroelectric capacitor 3 are formed on the second base dielectric film 24 of the base substrate 2. In accordance with the present embodiment, as a material film 31a for a base conductive section 31 that serves as a base for the ferroelectric capacitor 3, for example, a film of titanium aluminum nitride (TiAlN) is formed by a sputter method. Then, as a material film 32a for a lower electrode 32, for example, iridium (Ir), iridium oxide (IrOx), and platinum (Pt) films are sequentially formed on the material film 31a by a sputter method. Then, as a material film 33a for a ferroelectric film 33, for example, a layer of lead zirconate titanate (Pb (Zi, Ti) $O_3$: hereafter referred to as PZT) is formed on the material film 32a by a sol-gel method (CSD method), a sputter method, a MOCD method or the like. Then, as a material film 34a for an upper electrode 34, for example, Pt, IrOx and Ir films are sequentially formed on the material film 33a by a sputter method. Furthermore, in accordance with the present embodiment, as a material film 4a for a stopper film 4, a film of SiN is formed on the material film 34a for the upper electrode 34 by a CVD method, a sputter method of the like.

Figure 3C:
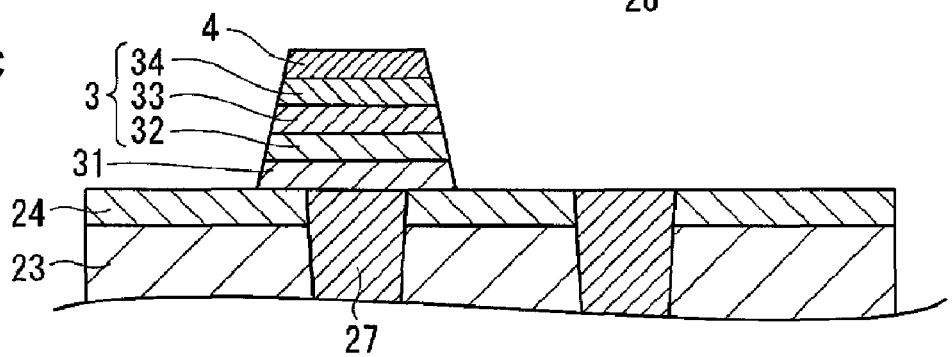

Next, as shown in FIG. 3C, the material films 31a, 32,a, 33a, 34a and 4a are patterned, thereby forming a base conductive layer 31, a ferroelectric capacitor 3 composed of a lower electrode 32, a ferroelectric film 33 and an upper electrode 34, and a stopper film 4. More specifically, a resist pattern (not shown) is formed on the material film 4a for the stopper film 4 by using, for example, known resist technique and photolithography technique. Then the material film 4a for the stopper film 4 is etched by using the resist pattern as a mask, thereby forming the stopper film 4. Then, the material films 34a, 33a, 32a and 31a are successively etched, using the stopper film 4 as a mask by, for example, a reactive ion etching method, a sputter-etching method, or the like, whereby the ferroelectric capacitor 3 and the base conductive portion 31 are formed.

According to a method in related art, a mask (that may corresponds to the stopper film 4 in accordance with the present embodiment) used in patterning for the ferroelectric capacitor 3 is removed after the patterning is completed. However, according to the method in accordance with the present embodiment, the stopper film 4 is not removed and retained, and shall be used in later steps.

Figure 3D:
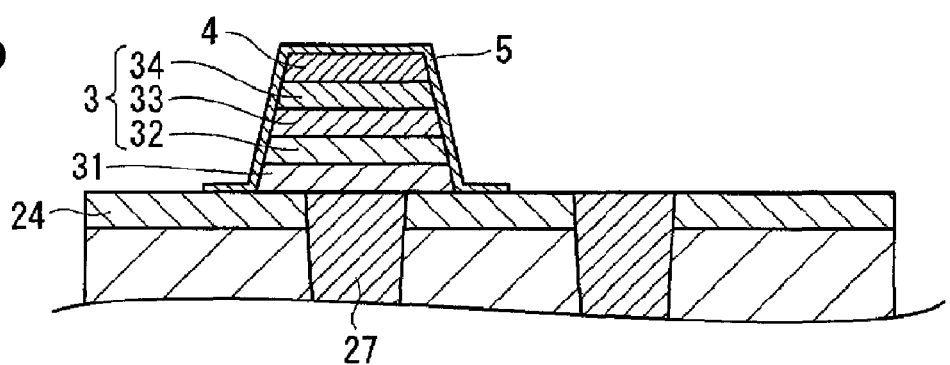

Next, a material film for a hydrogen barrier film 5, such as, for example, an AlOx film (not shown) is formed by a sputter method on the entire surface of the second base dielectric film 24 including the base conductive section 31, the ferroelectric capacitor 3 and the stopper film 4. Then, as shown in FIG. 3D, the AlOx film is patterned by using known resist technique and etching technique, thereby forming the hydrogen barrier film 5 that covers the side surface of the ferroelectric capacitor 3 and the upper surface and side surface of the stopper film 4, and further in accordance with the present embodiment, the side surface of the base conductive section 31 and the second base dielectric film 24 around the ferroelectric capacitor 3.

Figure 4A:
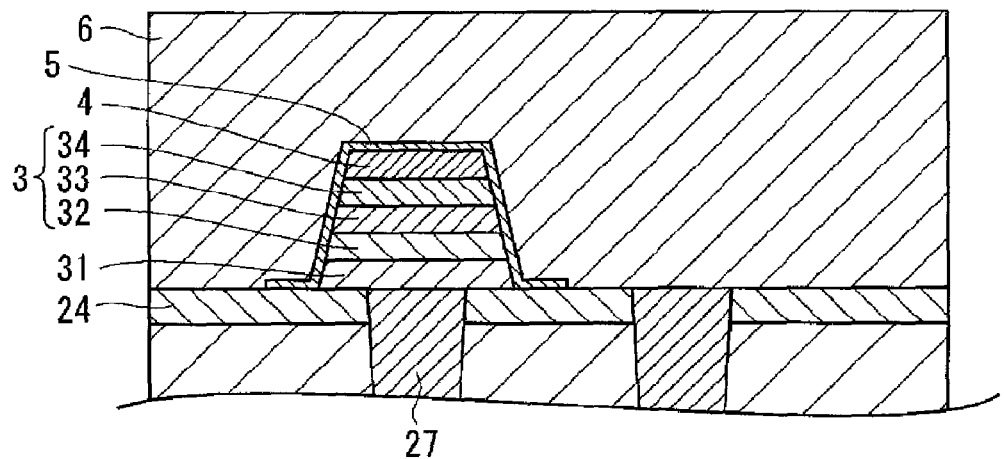
FIGS. 4A-4C are cross-sectional views schematically showing steps of the method for manufacturing a semiconductor device.

Next, as shown in FIG. 4A, $SiO_2$ is deposited in a layer in a manner to cover the second base dielectric film 24 including the hydrogen barrier film 5 by a CVD method, using, for example, TEOS or the like as the source material gas, and then the layer is thinned by a CMP method, an etch-back method or the like, thereby forming an interlayer dielectric film 6. In general, when the material gas (TEOS) for the interlayer dielectric film 6 chemically reacts, reducing gas, such as, hydrogen gas, water vapor and the like is generated. The ferroelectric film 33 of the ferroelectric capacitor 3 is formed from an oxide material (i.e., PZT in accordance with the present embodiment), and oxygen deficiencies would occur in the ferroelectric film 33 when exposed to the reducing gas, whereby the ferroelectric characteristics of the ferroelectric film 33 would be damaged and deteriorated. However, as the hydrogen barrier film 5 that covers the ferroelectric capacitor 3 is formed in accordance with the present embodiment, the ferroelectric capacitor 3 is prevented from being exposed to the reducing gas, and therefore the interlayer dielectric film 6 can be formed without deteriorating the ferroelectric film 33.

It is noted that, when a silicon wafer is used as the silicon substrate 21, similarly as in an ordinary method, it is difficult to make the depositing amount of $SiO_2$ and its film quality uniform across the surface of the silicon wafer, for example, between the center area and the peripheral area of the silicon wafer, or between an area where the ferroelectric capacitors 3 are densely arranged and an area where the ferroelectric capacitors 3 are sparsely arranged. Further, when the deposited $SiO_2$ film is thinned by polishing, the amount of polishing would vary from one area to another, if the deposited amount of $SiO_2$ and its film quality are not uniform, or multiple ferroelectric capacitors formed are arranged in different densities from one area to another. As a result, the thickness of the $SiO_2$ film has variations of about 20 nm to 30 nm.

Figure 4B:
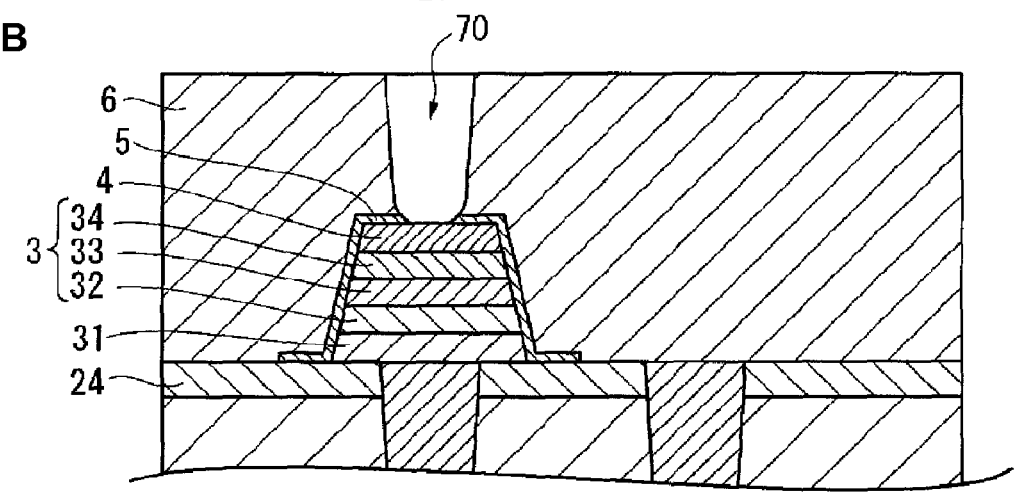
Figure 4C:
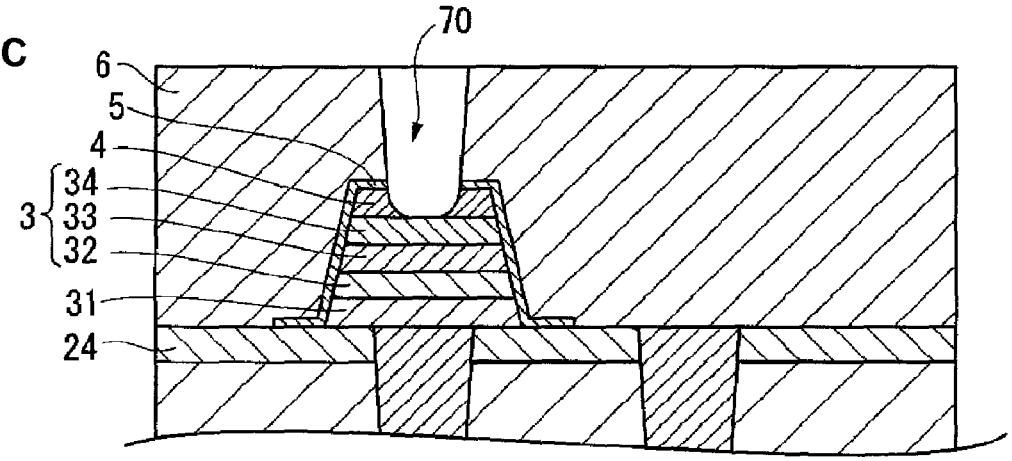

Next, as shown in FIG. 4B and 4C, the interlayer dielectric film 6, the hydrogen barrier film 5 and the stopper film 4 over the ferroelectric capacitor 3 are etched, thereby forming a contact hole 70 that exposes the upper electrode 34 of the ferroelectric capacitor. In accordance with the present embodiment, first, a resist pattern (not shown) is formed on the interlayer dielectric film 6 by using, for example, known resist technique and photolithography method. Then, by using the resist pattern as a mask, the interlayer dielectric film 6 and the hydrogen barrier film 5 are etched together by a dry etching method or the like, as shown in FIG. 4B.

Since a fourth plug 7 (see FIG. 1) that is to be embedded in the contact hole 70 in a later step needs to be conductively connected to the upper electrode 34 of the ferroelectric capacitor 3, the interlayer dielectric film 6 and the hydrogen barrier film 5 need to be securely penetrated by the contact hole 70. The interlayer dielectric film 6 has differences of about 20 nm to 30 nm in its thickness, as described above. Therefore, the etching may need to be excessively conducted such that the thickest portion thereof is penetrated, in consideration of the differences in the thickness.

Therefore, the stopper film 4 would have differences in its thickness because of excessive etching of the interlayer dielectric film 6 and the hydrogen barrier film 5. In other words, the stopper film 4 would hardly be etched at thick portions of the interlayer dielectric film 6, while the stopper film 4 would become thinned at thin portions of the interlayer dielectric film 6 because the stopper film 4 is exposed to the etching gas by the time the thick portions are penetrated. However, the stopper film 4 is formed from a material that can secure an etching selection ratio with respect to the interlayer dielectric film 6, such that the amount of the stopper film 4 etched at the time of etching the interlayer dielectric film 6 becomes extremely small, and the stopper film 4 has very small differences in its thickness.

In one aspect of the present embodiment, the etching selection ratio of the stopper film 4 with respect to the interlayer dielectric film 6 is set to about 20. For example, when differences in the thickness of the interlayer dielectric film 6 are 40 nm, the stopper film 4 may be etched in a thickness of about 2 nm maximum, while the interlayer dielectric film 6 and the hydrogen barrier film 5 are etched. As a result, the stopper film 4 has very small differences in its thickness.

Also, as shown in FIG. 4C, the stopper film 4 is etched, using the resist pattern (not shown) as a mask. It is noted that the stopper film 4 has a uniform thickness because differences in the thickness of the interlayer dielectric film 6 are not reflected therein. For this reason, when etching the stopper film 4, the stopper film 4 does not need to be over-etched in consideration of differences in its thickness, and therefore the stopper film 4 can be etched under an optimum etching condition. Therefore, the inner wall surface 41 (see FIG. 2A) of the contact hole 70 at the stopper film 4 can be processed in a desired shape, and can be provided with a concave curved surface that opens toward the interior of the contact hole 70.

Figure 5A:
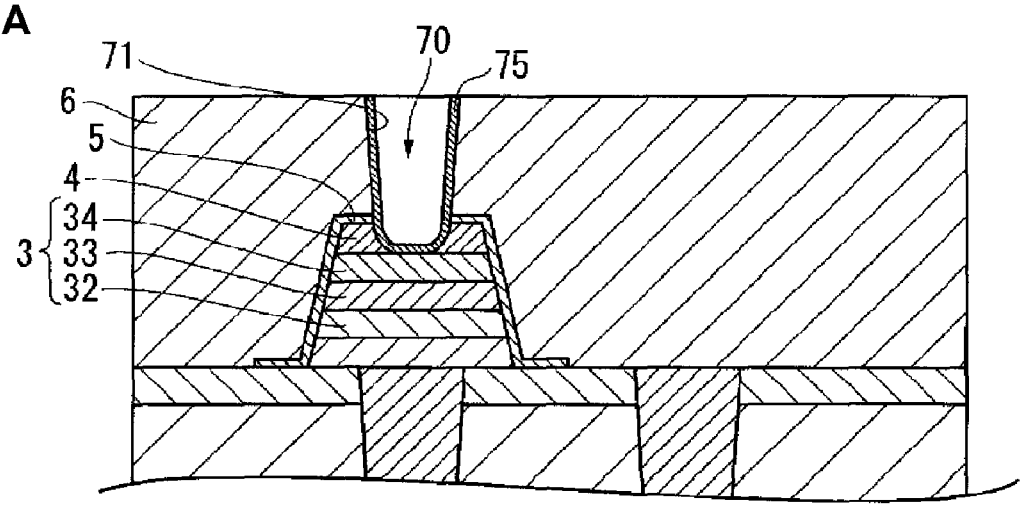
FIGS. 5A-5C are cross-sectional views schematically showing steps of the method for manufacturing a semiconductor device.

Next, as shown in FIG. 5A, a barrier metal 75 is formed with a conductive material having hydrogen barrier property, which covers the upper electrode 34 exposed inside the contact hole 70 and the inner wall surface 71 of the contact hole 70. In accordance with the present embodiment, films of Ti and TiN are sequentially formed by a sputter method, thereby forming the barrier metal 75 in a two-layer structure composed of the Ti film and the TiN film. As the stopper film 4 is formed in the method of the present embodiment of the invention, the barrier metal 75 can be formed without generating weak points.

According to a method in related art, the stopper film is not formed, and a hydrogen barrier film is provided in contact with a ferroelectric capacitor. However, the hydrogen barrier film has differences in the amount of etching which are caused by differences in the thickness of the interlayer dielectric film. For example, when the hydrogen barrier film is excessively etched, the inner wall surface of the contact hole at the hydrogen barrier film rises perpendicularly with respect to the top surface of the upper electrode. As a result, it is difficult to fill the material of the barrier metal in the corner between the inner wall surface of the hydrogen barrier film and the top surface of the upper electrode. Also, for example, when the hydrogen barrier film is etched insufficiently, the inner wall surface of the contact hole forms a stepped configuration (a convex shape protruding toward the interior of the contact hole) that protrudes toward the interior of the contact hole between the interlayer dielectric film side and the hydrogen barrier film side. For this reason, the coverage of the material of the barrier metal is damaged at the stepped section. In this manner, in the related art, the portion of the barrier metal that is not formed in good quality has an insufficient thickness and forms cracks, which present weak points.

In contrast, in accordance with the present embodiment of the invention, the stopper film 4 is formed, and the stopper film 4 can be processed without being influenced by differences in the thickness of the interlayer dielectric film 6, and the inner wall surface 41 can be formed in a desired shape, in other words, can be formed in a concave curved surface that opens toward the interior of the contact hole 70. Therefore, the coverage of the material of the barrier metal 75 is improved, and the barrier metal 75 can be formed without generating weak points.

Figure 5B:
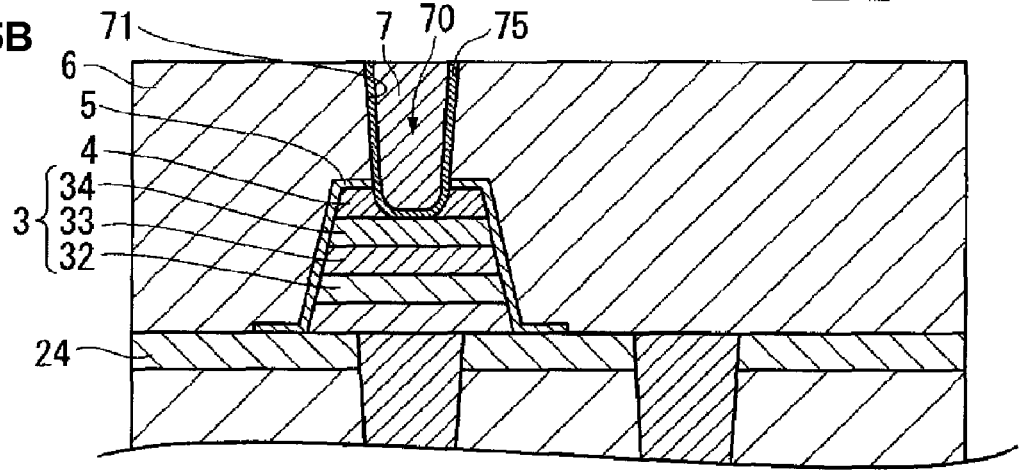
Figure 5C:
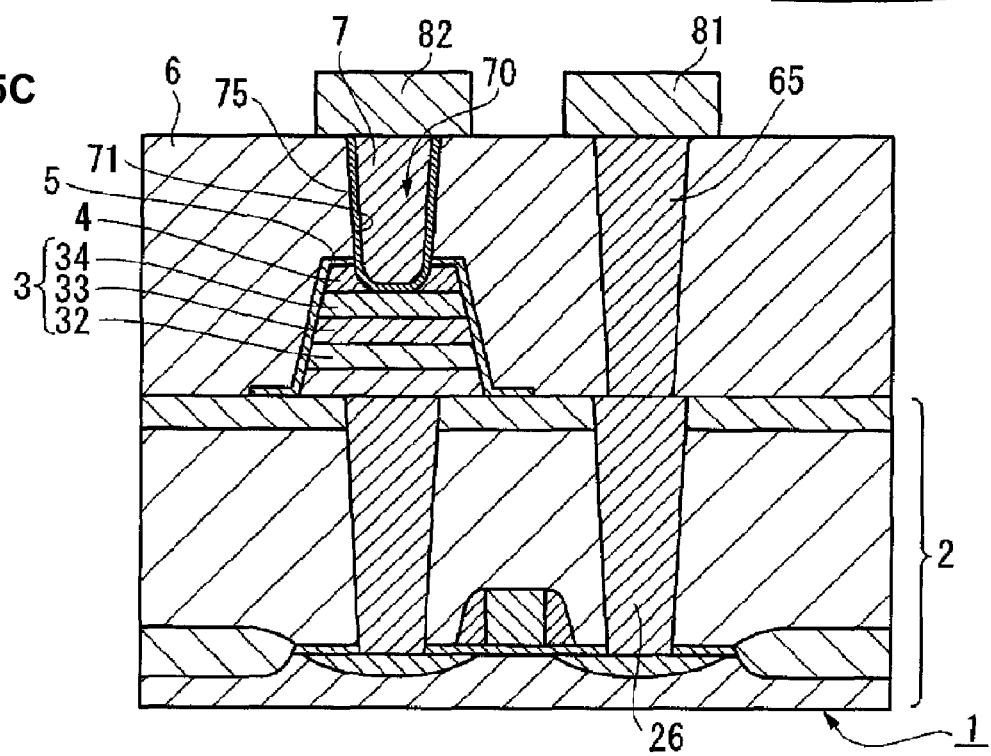

Next, as shown in FIG. 5B, a fourth plug (plug conductive section) 7 that conductively connects to the barrier metal 75 is embedded in the contact hole 70. More specifically, for example, tungsten is deposited in a film by a CVD method on the entire surface of the interlayer dielectric film 6 including inside the contact hole 70, thereby embedding the tungsten inside the contact hole 70. Then, by polishing portions over the interlayer dielectric film 6 by a CMP method or the like, the tungsten on the interlayer dielectric film 6 is removed, and the fourth plug 7 is embedded in the contact hole 70.

Normally, the films are formed in a reducing atmosphere according to the CVD method. However, in the method in accordance with the present embodiment, the barrier metal 75 having hydrogen barrier property which covers the upper electrode 34 is formed, and weak points are not generated in the barrier metal 75. As a result, the reducing gas, such as, hydrogen gas and the like cannot penetrate the ferroelectric capacitor 3 through weak points, and therefore the ferroelectric film 33 can be prevented from being reduced or deteriorated.

Next, a third plug 65 is formed on the first plug 26 in the interlayer dielectric film 6, in a manner to be conductively connected to the first plug 26. More specifically, a through hole that exposes the first plug 26 is formed, like the first plug 26. Then, films of Ti and TiN are sequentially formed by a sputter method in the through hole, thereby forming an adhesion layer (not shown). Then, tungsten is formed in a film by, for example, a CVD method on the entire top surface of the interlayer dielectric film 6 including inside the through hole, thereby embedding the tungsten inside the through hole. Portions over the interlayer dielectric film 6 are polished by a CMP method or the like, whereby the tungsten on the interlayer dielectric film 6 is removed, leaving a third plug 65 embedded inside the through hole.

Then, a film of aluminum is formed by, for example, a sputter method on the interlayer dielectric film 6 where the third plug 65 is formed, and the film is patterned by known resist technique and etching technique, thereby forming a bit line 81 conductively connected to the third plug 65 and a ground line 82 conductively connected to the fourth plug 7. In this manner, the ferroelectric memory device 1 can be manufactured.

According to the method for manufacturing a semiconductor device in accordance with the present embodiment of the invention, the stopper film 4 is formed such that differences in the thickness of the interlayer dielectric film 6 can be absorbed by the stopper film 4, and the contact hole 70 can be formed in a highly accurate shape. Accordingly, the inner wall surface 41 of the stopper film 4 can be formed in a desired shape, and the barrier metal 75 can be formed without generating weak points. As a result, when forming the fourth plug (plug conductive section) 7, the ferroelectric film 33 of the ferroelectric capacitor 3 can be prevented from being reduced or deteriorated. In this manner, a ferroelectric memory device (a semiconductor device) 1 equipped with the ferroelectric capacitor 3 having excellent hysteresis characteristics can be manufactured.

Also, according to the method in accordance with the present embodiment, the stopper film 4, which is used as a mask in etching to form the ferroelectric capacitor 3, is made to function as a stopper when forming the interlayer dielectric film 6, such that an independent stopper film does not need to be formed. Accordingly, the ferroelectric memory device 1 can be efficiently manufactured without complicating the process. Also, no deviations occur in alignment between the stopper film 4 and the ferroelectric capacitor 3, such that the ferroelectric memory device 1 can be efficiently manufactured without damaging the yield.

Also, in the ferroelectric memory device 1 manufactured by the manufacturing method in accordance with the present embodiment of the invention, the ferroelectric film 33 of the ferroelectric capacitor 3 is prevented from being reduced or deteriorated, such that the ferroelectric memory device 1 equipped with the ferroelectric capacitor 3 having excellent hysteresis characteristics achieves a favorable bit yield.

Moreover, although the present embodiment is applied to a stacked type ferroelectric memory device 1, the embodiment may be applied to a planer type or the like. Also, the mask that is used in etching to form the ferroelectric capacitor 3 may not be used as the stopper film 4, but instead, an independent stopper film may be formed after forming the ferroelectric capacitor 3. In this case, a stopper film 4 that covers the top surface and the side surface of the ferroelectric capacitor 3 may be formed. Further, if the stopper film 4 is formed from a material having hydrogen barrier property, the hydrogen barrier property of the hydrogen barrier film 5 can be enhanced.

Also, for example, the bit line 81 and the ground line 82 may be interchanged with each other, so that the upper electrode 34 of the ferroelectric capacitor 3 becomes conductive with the bit line, and other wiring structures such as multilayer wirings and the like may be used.

Moreover, the contact hole 70 and the through hole in which the third plug 65 is embedded may be formed in a batch by etching. In this case, the barrier metal 75 and the adhesion layer within the through hole, and the fourth plug 7 and the third plug 65 may be concurrently formed. In this case, however, the etching selection ratio of the stopper film 4 with respect to the interlayer dielectric film 6 may preferably be set to 20 or higher.

What is claimed is:

1. A semiconductor device comprising:
   a ferroelectric capacitor that is provided above a base substrate and includes a first electrode, a ferroelectric film provided on the first electrode and a second electrode provided on the ferroelectric film;
   a stopper film that covers a top surface of the second electrode of the ferroelectric capacitor;
   a hydrogen barrier film that covers a top surface and a side surface of the stopper film and a side surface of the ferroelectric capacitor;
   an interlayer dielectric film that covers the hydrogen barrier film and the base substrate;
   a contact hole that penetrates the interlayer dielectric film, the hydrogen barrier film and the stopper film and exposes the second electrode, an inner diameter of the contact hole decreasing between an upper surface of the interlayer dielectric film and the hydrogen barrier film;
   a barrier metal that covers the second electrode exposed in the contact hole and an inner wall surface of the contact hole and is formed from a conductive material having hydrogen barrier property; and
   a plug conductive section that is embedded in the contact hole and conductively connects to the barrier metal,
   wherein the stopper film is formed from a dielectric material having a smaller etching rate than an etching rate of the interlayer dielectric film.

2. A semiconductor device according to claim 1, wherein the stopper film is formed from a material having an etching selection ratio of 15 or higher with respect to the interlayer dielectric film.

3. A semiconductor device according to claim 1, wherein the stopper film has hydrogen barrier property.

4. A semiconductor device according to claim 1, wherein the stopper film is formed from silicon nitride.

5. A semiconductor device according to claim 1, wherein an inner wall surface of the contact hole at the stopper film includes a concave curved surface facing the interior of the contact hole, and the contact hole at the stopper film has an inner diameter that gradually becomes smaller toward the second electrode.

6. A semiconductor device according to claim 1, wherein an inner wall surface of the contact hole from an upper surface of the hydrogen barrier film to a lower surface of the stopper film includes a concave curved surface facing the interior of the contact hole, and the contact hole at the stopper film and the hydrogen barrier film has an inner diameter that gradually becomes smaller toward the second electrode.

7. A method for manufacturing a semiconductor device, comprising the steps of:

forming, above a substrate, a laminate having a ferroelectric capacitor including a first electrode, a ferroelectric film and a second electrode successively laminated and a stopper film that covers a top surface of the second electrode of the ferroelectric capacitor; forming a hydrogen barrier film that covers a top surface and a side surface of the stopper film and a side surface of the ferroelectric capacitor; forming an interlayer dielectric film that covers the hydrogen barrier film and the substrate; etching the interlayer dielectric film, the hydrogen barrier film and the stopper film thereby forming a contact hole that exposes the second electrode, an inner diameter of the contact hole decreasing between an upper surface of the interlayer dielectric film and the hydrogen barrier film; forming a barrier metal that covers the second electrode exposed in the contact hole and an inner wall surface of the contact hole and is composed of a conductive material having hydrogen barrier property; and embedding a plug conductive section conductively connected to the barrier metal inside the contact hole, wherein the stopper film is formed from a material that creates an etching selection ratio with respect to the interlayer dielectric film.

8. A method for manufacturing a semiconductor device according to claim 7, wherein, in the step of forming a laminate, material films for the first electrode, the ferroelectric film and the second film are successively formed above the substrate, and after forming the stopper film on the material films, the material films are etched using the stopper film as a mask to form the laminate.

9. The method of claim 7 wherein an inner wall surface of the contact hole from an upper surface of the hydrogen barrier film to a lower surface of the stopper film includes a concave curved surface facing the interior of the contact hole, and the contact hole at the stopper film and the hydrogen barrier film has an inner diameter that gradually becomes smaller toward the second electrode.

* * * * *